(12) United States Patent
Yang et al.

(10) Patent No.: US 12,394,944 B2
(45) Date of Patent: Aug. 19, 2025

(54) CABLE CONNECTOR WITH LOW CROSSTALK

(71) Applicant: Elka International Ltd., New Taipei (TW)

(72) Inventors: Jui-Ming Yang, New Taipei (TW); Yen-Tung Chen, New Taipei (TW)

(73) Assignee: Elka International Ltd., New Taipei (TW)

( * ) Notice: Subject to any disclaimer, the term of this patent is extended or adjusted under 35 U.S.C. 154(b) by 322 days.

(21) Appl. No.: 18/212,556

(22) Filed: Jun. 21, 2023

(65) Prior Publication Data

US 2024/0291208 A1 Aug. 29, 2024

(30) Foreign Application Priority Data

Feb. 24, 2023 (TW) .................................. 112201684

(51) Int. Cl.
*H01R 13/68* (2011.01)
*H01R 12/51* (2011.01)
*H01R 13/6585* (2011.01)

(52) U.S. Cl.
CPC ......... *H01R 13/6585* (2013.01); *H01R 12/51* (2013.01)

(58) Field of Classification Search
CPC .................................................. H01R 13/6865
USPC .......................... 439/493, 492, 76.1, 77, 676
See application file for complete search history.

(56) References Cited

U.S. PATENT DOCUMENTS

| 6,585,528 | B1 * | 7/2003 | Lin | H01R 13/6658 |
| | | | | 439/942 |
| 7,758,374 | B2 * | 7/2010 | Yu | H01R 24/60 |
| | | | | 439/493 |
| 8,858,254 | B2 * | 10/2014 | Ikari | H01R 43/16 |
| | | | | 439/492 |
| 12,334,659 | B2 * | 6/2025 | Toda | H05K 1/117 |
| 2017/0068061 | A1 * | 3/2017 | Yang | G02B 6/3882 |
| 2018/0048095 | A1 | 2/2018 | Oberski et al. | |

FOREIGN PATENT DOCUMENTS

CN 210224464 U 3/2020

OTHER PUBLICATIONS

European search report issued on Nov. 29, 2023.

* cited by examiner

*Primary Examiner* — Phuong K Dinh
(74) *Attorney, Agent, or Firm* — Chun-Ming Shih; HDLS IPR SERVICES (57) ABSTRACT

A cable connector includes a connector body, a cable, a circuit board, and a bump block. The connector body is provided with a plurality of plug terminals welded on a plurality of terminal pads on the circuit board. A plurality of upper and lower core wires of the cable are welded on a plurality of core wire pads on the top and bottom surfaces of the circuit board. The wire divider includes a plurality of grooves and at least one perforation. Each core wire is embedded in the corresponding groove. The bump block is inserted into the perforation. Part of the bump block passes through the perforation and is located between the cable's upper and lower core wires. Through the shielding effect of the bump block, it can avoid to form the electrical coupling between the upper and lower core wires so as to reduce crosstalk.

10 Claims, 12 Drawing Sheets

CABLE CONNECTOR WITH LOW CROSSTALK

This non-provisional application claims priority claim under 35 U.S.C. § 119(a) on Taiwan Patent Application No. 112201684 filed Feb. 24, 2023, the entire contents of which are incorporated herein by reference.

FIELD OF THE INVENTION

This disclosure relates to a cable connector, particularly to a cable connector capable of reducing crosstalk.

BACKGROUND

Figure 1:
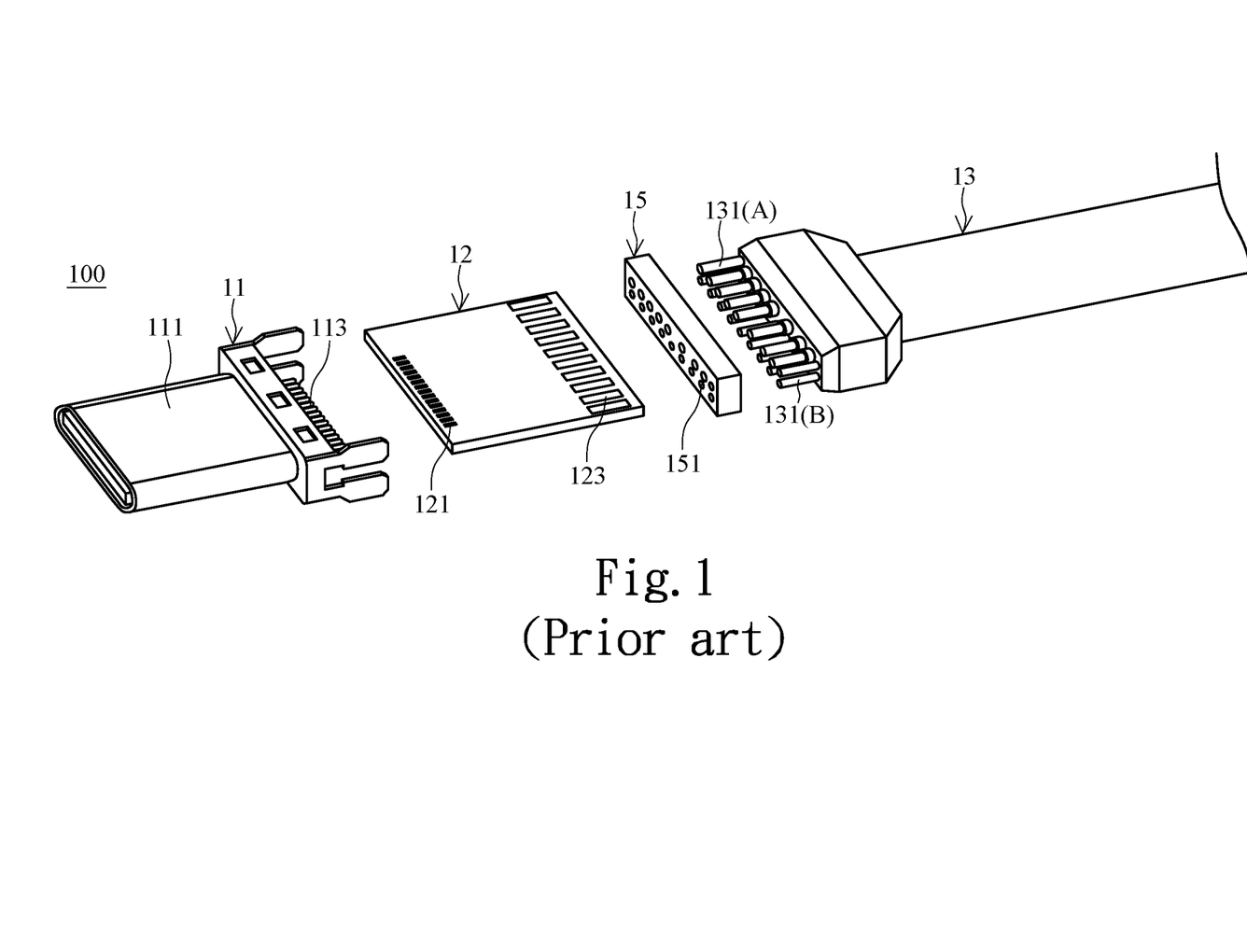
FIG. 1 is a three-dimensional exploded view of a cable connector in the prior art.
Figure 2:
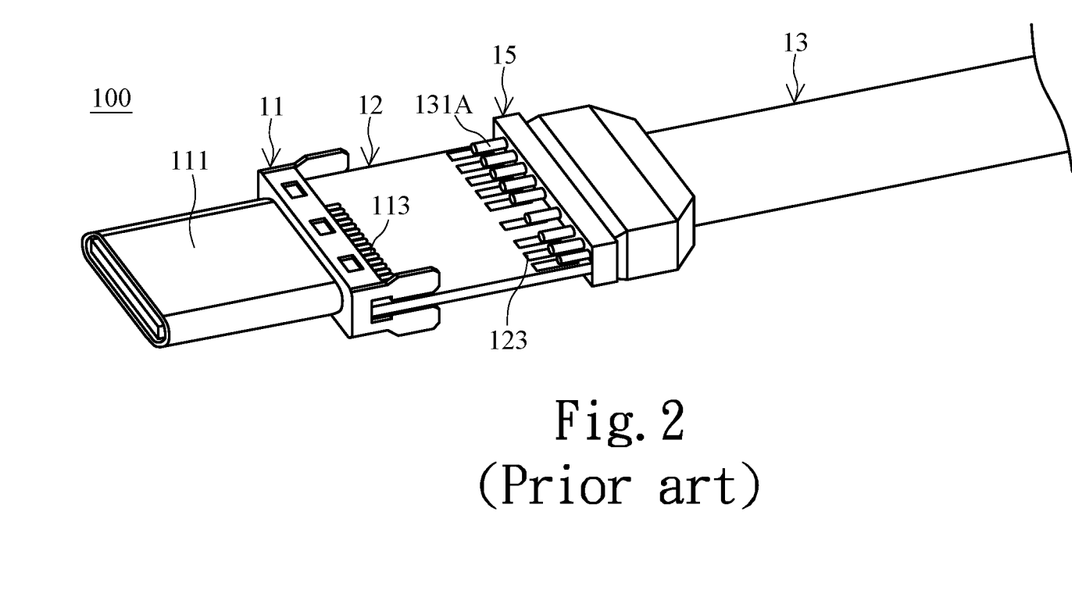
FIG. 2 is a three-dimensional combined view of a cable connector in the prior art.
Figures 3, 3A:
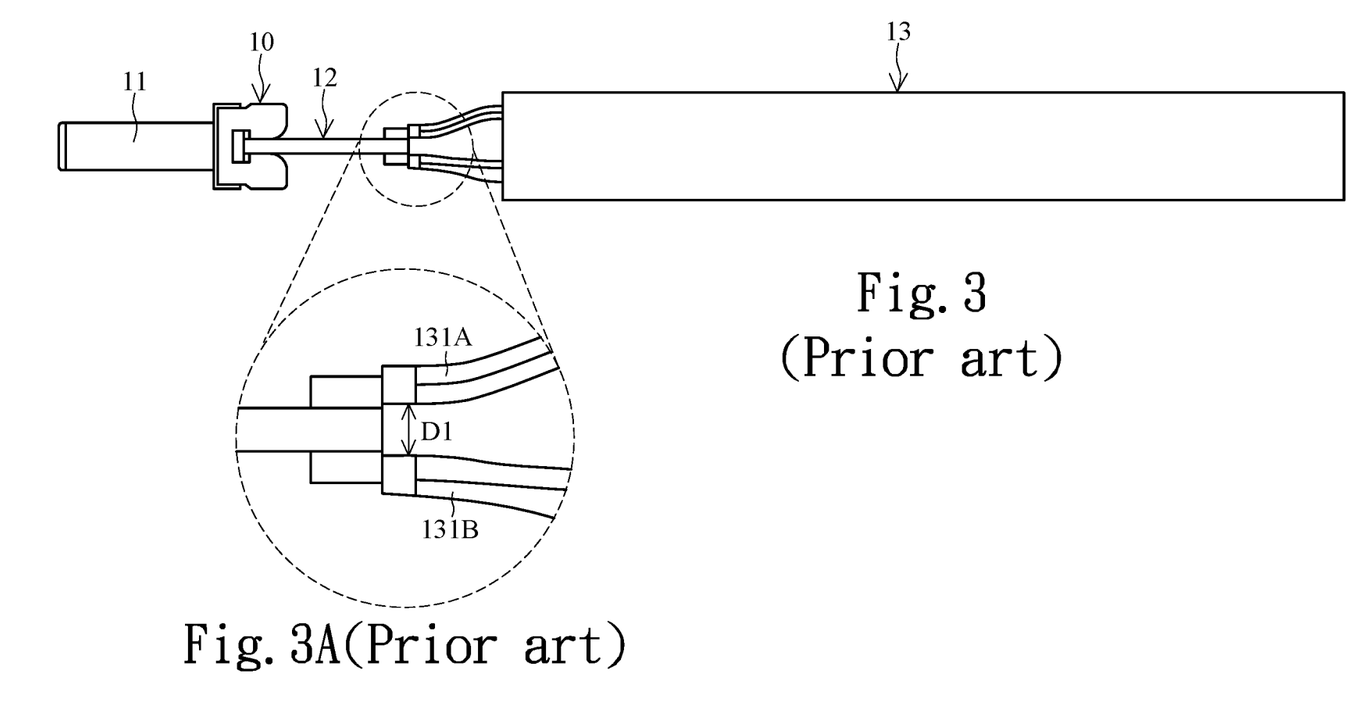
FIG. 3 is a cross-section view of a cable connector in the prior art.
FIG. 3A is an enlarged view of the partial structure of FIG. 3.

Referring to FIG. 1, FIG. 2, and FIG. 3, a three-dimensional exploded view, a three-dimensional combined view and a cross-section view of a cable connector in the prior art are shown. As shown in FIG. 1, the conventional cable connector 100 includes a connector body 11, a circuit board 12, and a cable 13.

The connector body 11 is provided with a front end including a plug 111, and provided with a rear end including a plurality of plug terminals 113. An upper surface at one side of the circuit board 12 is configured with a plurality of terminal pads 121, and an upper surface and a lower surface at other side of the circuit board 12 are configured with a plurality of core wire pads 123. The cable 13 includes a plurality of core wires 131A, 13B. For example, the upper core wires 131A and the lower core wires 131B. The plug terminals 113 will be welded on the terminal pads 121. The upper core wires 131A of the cable 13 will be welded on the core wire pads 123 on the upper surface of the circuit board 12, and the lower core wires 131B of the cable 13 will be welded on the core wire pads 123 on the lower surface of the circuit board 12.

Figure 4:
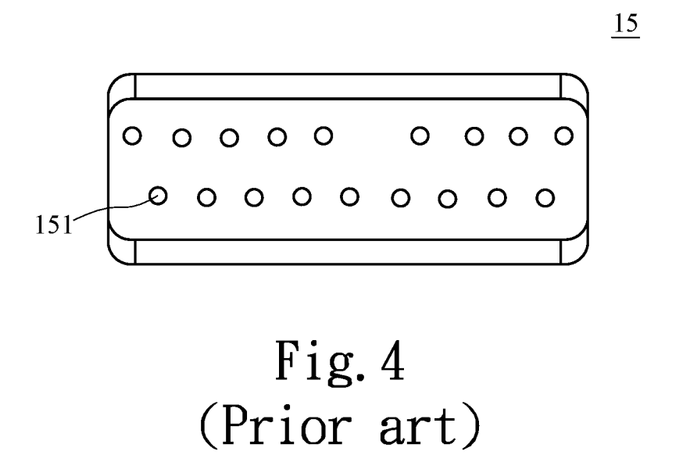
FIG. 4 is a front view of a wire divider in the prior art.
Figure 5:
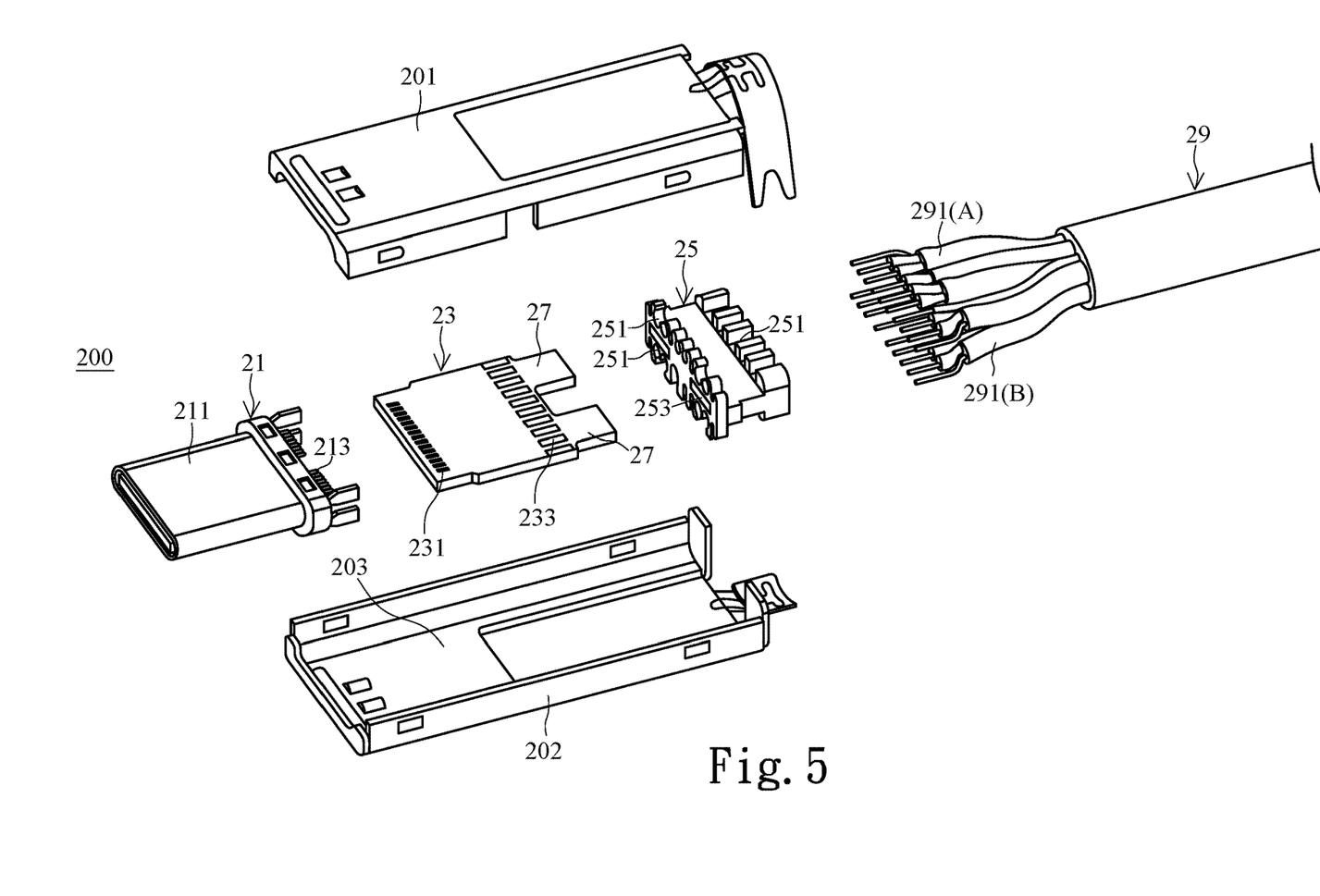
FIG. 5 is a three-dimensional exploded view of a cable connector of the disclosure.

As shown in FIG. 1, FIG. 2, and FIG. 4, in order to prevent the adjoining core wires 131A and 131B of the cable from electrically contacting each other, the conventional cable connector 100 can further include a wire divider 15. The wire divider 15 is provided with a plurality of perforations 151 in the middle thereof. Each core wire 131A, 131B of the cable 13 passes through the corresponding perforation 151 to weld on the core wire pad 123.

Moreover, due to a large amount of audio-visual data signals, the transmission speed requirements of cable connectors are also getting higher and higher. For example, the transmission speed of the cable connector is required from Mbps to Gbps. However, when the conventional cable connector 100 is applied in high-frequency and high-speed transmission, some of the upper core wires 131A and the lower core wires 131B are close together (as shown in FIG. 3A, a minimum distance between the part of the upper core wires 131A and part of the lower core wires 131B is only D1) will generate an electrical coupling, which will form a crosstalk on the conventional cable connector 100. Thus, the data signal transmitted by the conventional cable connector 100 will be attenuated or interrupted due to the crosstalk interference. Here, the reducing of crosstalk is currently a problem to be overcome in the field of cable signal transmission.

SUMMARY

The disclosure aims to provide a cable connector with low crosstalk. The cable connector of the disclosure includes a connector body, a circuit board, a wire divider, at least one bump block, and a cable. When the cable connector is assembled, a plurality of plug terminals of the connector body will be welded on a plurality of terminal pads of the circuit board, a plurality of core wires in an upper row of the cable will be welded on a plurality of core wire pads on an upper surface of the circuit board, and a plurality of core wires in a lower row will be welded on a plurality of core wire pads on a lower surface of the circuit board. The wire divider includes a plurality of grooves and at least one perforation. Each of the upper row and lower row core wires is embedded in the corresponding grooves to be fixed by the corresponding grooves. The bump block is inserted into the perforation of the wire divider. Besides, part of the bump block passes through the perforation, and is located between part of the upper row core wires and part of the lower row core wires. Through the shielding effect of the bump block, it can avoid to form an inductive and capacitive coupling between the upper row core wires and the lower row core wires, which may be caused by their close proximity, and thereby reducing the generation of crosstalk and enhancing the quality of the signal transmitted by the cable connector.

To achieve the above objective, the disclosure provides a cable connector with low crosstalk, including: a connector body, provided with one end including a plug, and provided with other end including a plurality of plug terminals: a cable including a plurality of core wires: a circuit board, provided at one side thereof configured with a plurality of terminal pads, and provided at other side thereof configured with a plurality of core wire pads; wherein the plurality of plug terminals of the connector body are welded on the plurality of terminal pads, and the plurality of core wires of the cable are welded on the plurality of core wire pads of the circuit board; at least one bump block, arranged beside the other side of the circuit board, and extended outward from the other side of the circuit board; and a wire divider including a plurality of grooves and at least one perforation, wherein each of the plurality of core wires is embedded in the corresponding groove, and the at least one bump block is inserted into the at least one perforation: wherein part of the at least one bump block passes through the at least one perforation, and is located between the plurality of core wires of the cable.

In one embodiment of the discourse, the number of the least one bump block is two.

In one embodiment of the discourse, the cable connector includes an upper cover and a lower cover. The plug terminals of the connector body, the circuit board, the wire divider, and part of the cable are placed in an accommodating space between the upper cover and the lower cover.

In one embodiment of the discourse, the cable connector is a connector conforming to USB, HDMI, or Display Port standard protocol.

In one embodiment of the discourse, the bump block is a multi-layered board including at least one grounded metal layer; the grounded metal layer in the bump block generates a shield effect between the core wires in the upper row and the core wires in the lower row.

The disclosure further includes a cable connector with low crosstalk, including: a connector body, provided with one end including a plug, and provided with other end including a plurality of plug terminals: a cable including a plurality of core wires; a circuit board, provided at one side thereof configured with a plurality of terminal pads, and provided at other side thereof configured with a plurality of core wire pads: wherein the plurality of plug terminals of the connector body are welded on the plurality of terminal pads, and the plurality of core wires of the cable are welded on the plurality of core wire pads of the circuit board; and at least one bump block, arranged beside the other side of the circuit board, extended outward from the other side of the circuit board, and located between the plurality of core wires of the cable; wherein the at least one bump block is a multi-layered board including at least one grounded metal layer, the at least one grounded metal layer in the at least one bump block generates a shield effect between the plurality of core wires in upper row and the plurality of core wires in lower row.

DETAILED DESCRIPTION OF THE PREFERRED EMBODIMENTS

Referring to FIG. 5, FIG. 6, FIG. 7, FIG. 8, and FIG. 9, there are shown a three-dimensional exploded view of a cable connector of the disclosure, a cross-section view of the cable connector of the disclosure, a three-dimensional combined view before an upper cover and a lower cover of the cable connector of the disclosure are closed, a three-dimensional combined view after the upper cover and the lower cover of the cable connector of the disclosure has closed, and a front view of a wire divider of the disclosure. As shown in FIG. 5, FIG. 6, FIG. 7, FIG. 8, and FIG. 9, the cable connector 200 is a connector conforming to USB, HDMI, or Display Port standard protocol, and includes a connector body 21, a circuit board 23, a wire divider 25, at least one bump block 27, and a cable 29.

The connector body 21 is provided with one end including a plug 211, and provided with other end including a plurality of plug terminals 213. The circuit board 23 is provided at one side thereof configured with a plurality of terminal pads 231, and provided at other side thereof configured with a plurality of core wire pads 233. The wire divider 25 includes a plurality of grooves 251 and at least one perforation 253. These grooves 251 are configured on the upper and lower surfaces of the wire divider 25. The perforation 253 is located between two sides of the wire divider 25. The bump block 27 is arranged beside the other side of the circuit board 23, and extended outward from the other side of the circuit board 23. The cable 29 includes a plurality of core wires 291A, 291B, for example, the upper row core wires 291A and the lower row core wires 291B. Preferably, the number of the at least one perforation 253 of the wire divider 25 and the number of the at least one bump block 27 is two.

When the cable connector 200 is assembled, the plug terminals 213 of the connector body 21 will be welded on the terminal pads 231, the upper row core wires 291A will be welded on the core wire pads 233 on the upper surface of the circuit board 23, and the lower row core wires 291B will be welded on the core wire pads 233 on the lower surface of the circuit board 23. Each of the core wires 291A, 291B is embedded in one or two corresponding grooves 251 to be fixed by the corresponding grooves 251. The bump block 27 is inserted into the perforation 253 of the wire divider 25. Besides, part of the bump block 27 passes through the perforation 253, and is located between part of the upper row core wires 291A and part of the lower row core wires 291B.

Figures 6, 6A:
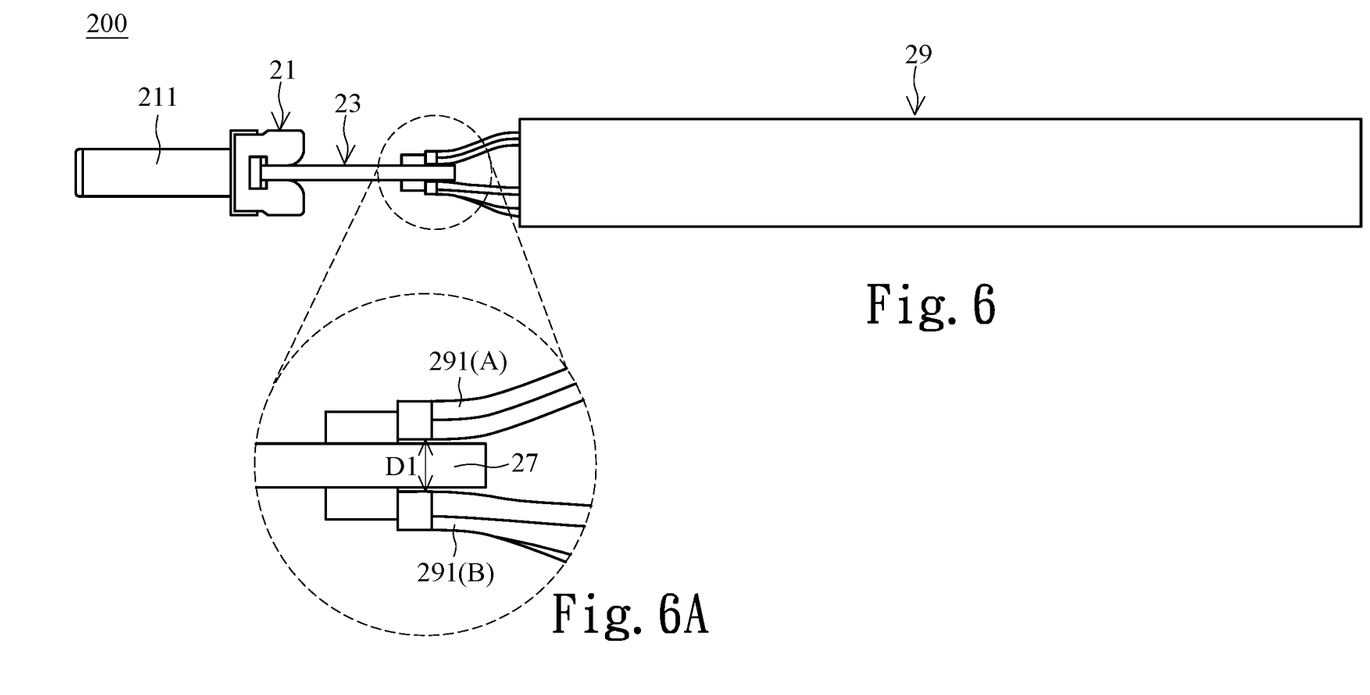
FIG. 6 is a cross-section view of the cable connector of the disclosure.
FIG. 6A is an enlarged view of the partial structure of FIG. 6.

As shown in FIG. 6 and FIG. 6A, when the upper core wires 291A and the lower core wires 291B are welded on the core wire pads 233, part of the upper core wires 291A and part of the lower core wires 291B will be very close. For example, a minimum distance between part of the upper row core wires 291A and part of the lower row core wires 291B is only D1. In one embodiment of the disclosure, the bump block 27 is integrally formed with the circuit board 23. The circuit board 23 and the bump block 27 are multi-layered boards, which include at least one grounded metal layer. When the bump block 27 is arranged between the upper row core wires 291A and the lower row core wires 291B, the grounded metal layer in the bump block 27 will generate a shield effect between the upper row core wires 291A and the lower row core wires 291B. Through the shielding effect of the bump block 27, it can avoid to form an inductive and capacitive coupling between the upper row core wires 291A and the lower row core wires 291B, which may be caused by their close proximity, and thereby reducing the occurrence of crosstalk and improving the quality of signal transmitted by the cable connector 200.

Figure 7:
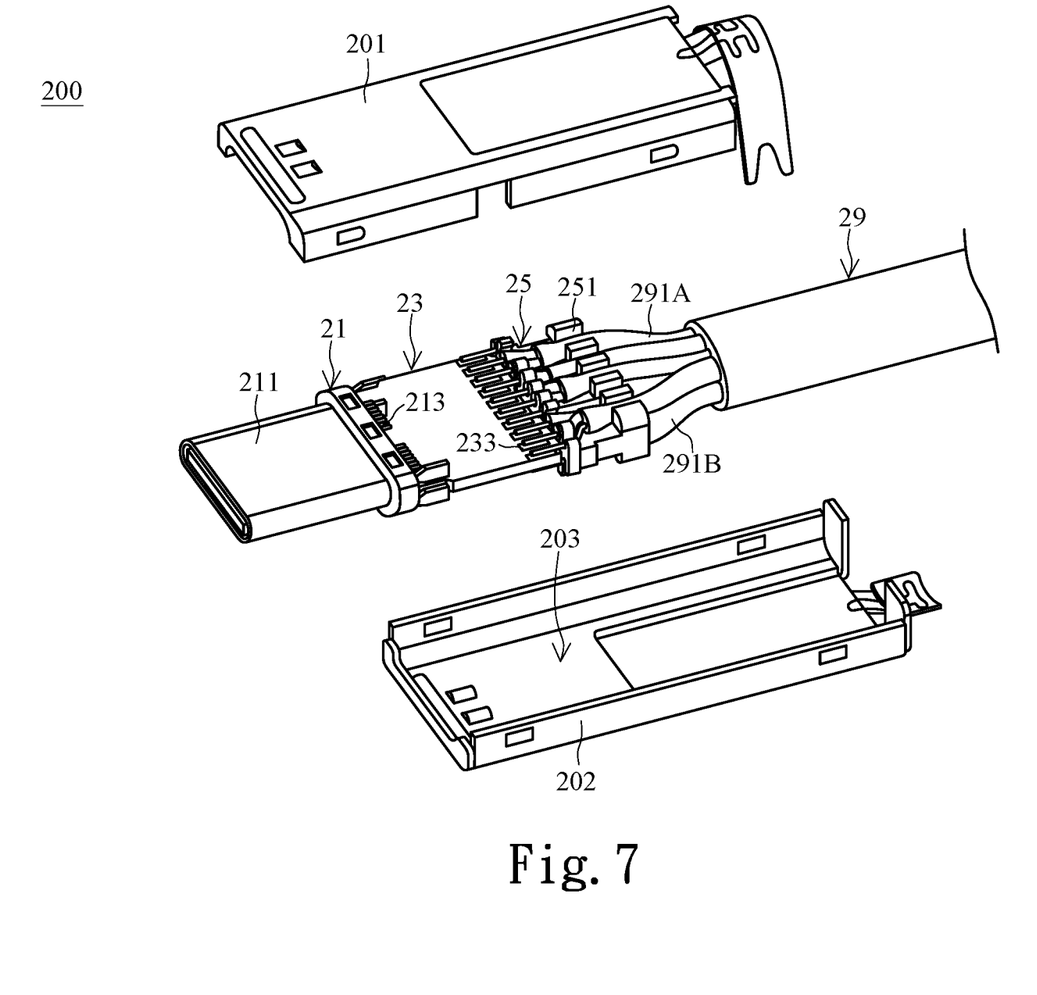
FIG. 7 is a three-dimensional combined view before an upper cover and a lower cover of the cable connector of the disclosure are closed.
Figure 8:
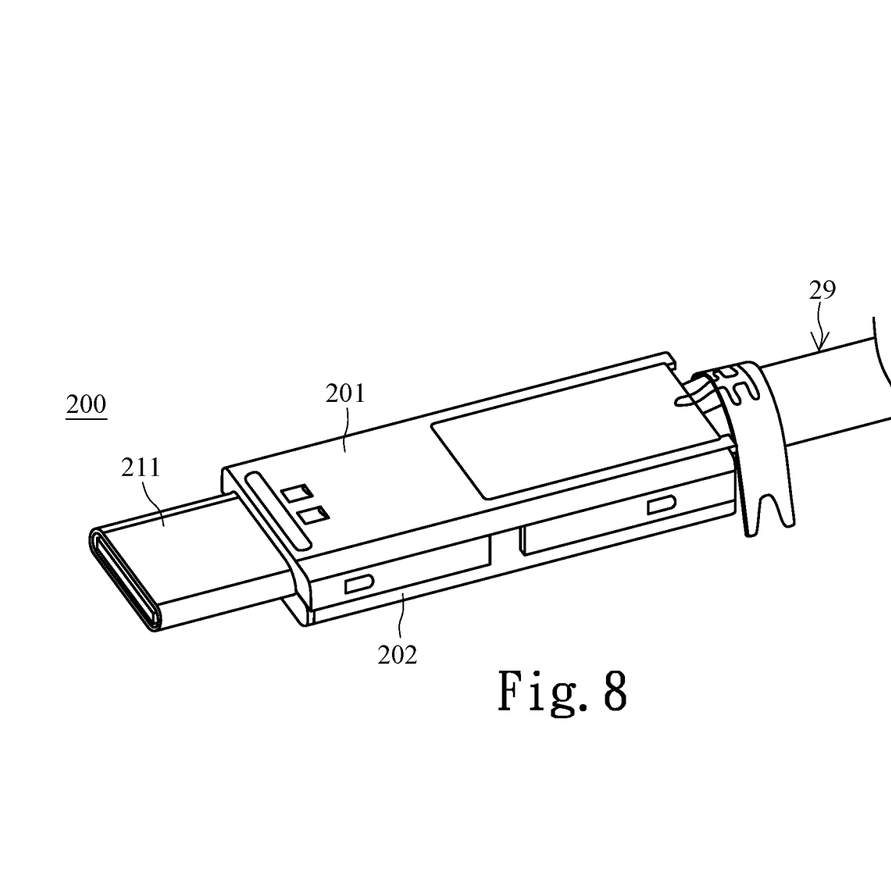
FIG. 8 is a three-dimensional combined view after the upper cover and the lower cover of the cable connector of the disclosure has closed.
Figure 9:
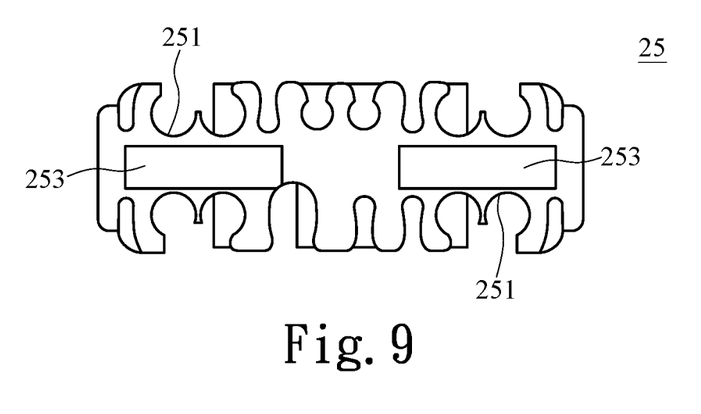
FIG. 9 is a front view of a wire divider of the disclosure.

In order to protect circuit structures inside the cable connector 200, the cable connector 200 further includes an upper cover 201 and a lower cover 202. When the upper cover 201 is closed on the lower cover 202, the plug terminals 211 of the connector body 21, the circuit board 23, the wire divider 25, and part of the core wires 219A, 219B will be placed in an accommodating space 203 between the upper cover 201 and the lower cover 202.

In another embodiment of the disclosure, the cable connector 200 does not include the wire divider 25. The upper row core wires 291A and the lower row core wires 291B are directly welded on the corresponding core wire pads 233 on the upper and lower surfaces of the circuit board 23, and the bump block 27 is directly protruded between the upper row core wires 291A and the lower row core wires 291B.

Figure 10:
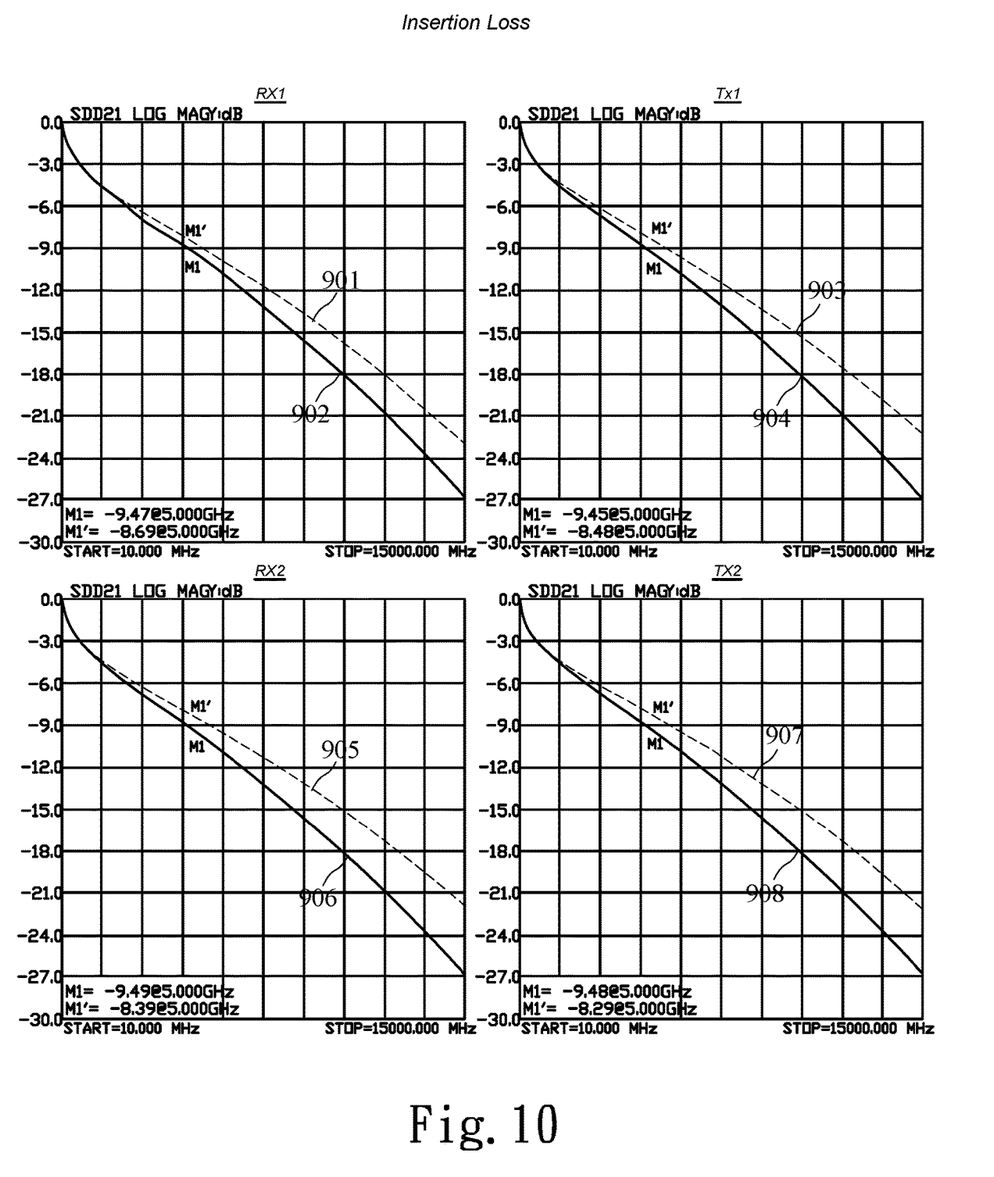
FIG. 10 is an oscillogram obtained by measuring insertion loss to the conventional cable connector and the cable connector of the disclosure, respectively.

Referring to FIG. 10, an oscillogram is shown by measuring insertion loss to the conventional cable connector and the cable connector of the disclosure, respectively. As shown in FIG. 10, curves 901, 903, 905, and 907 are obtained by the measurement of insertion loss for receiving wires (RX1, RX2) and transmitting wires (TX1, TX2) of the cable 13 of the conventional cable connector 100, and curves 902, 904, 906, 908 are obtained by the measurement of insertion loss for receiving wires (RX1, RX2) and transmitting wires (TX1, TX2) of the cable 29 of the cable connector 200 of the disclosure.

Taking a sampling point at a frequency of 5 GHz is as a reference. The insertion loss in the curves 902, 904, 906, 908 of the cable connector 200 of the disclosure are below about 1 dB~1.5 dB than the insertion loss in the curves 901, 903, 905, 907 of the conventional cable connector 100. Besides, as shown in FIG. 10, the cable connector 200 of the disclosure operates at a higher-frequency and higher-speed, so its insertion loss is lower.

Figure 11:
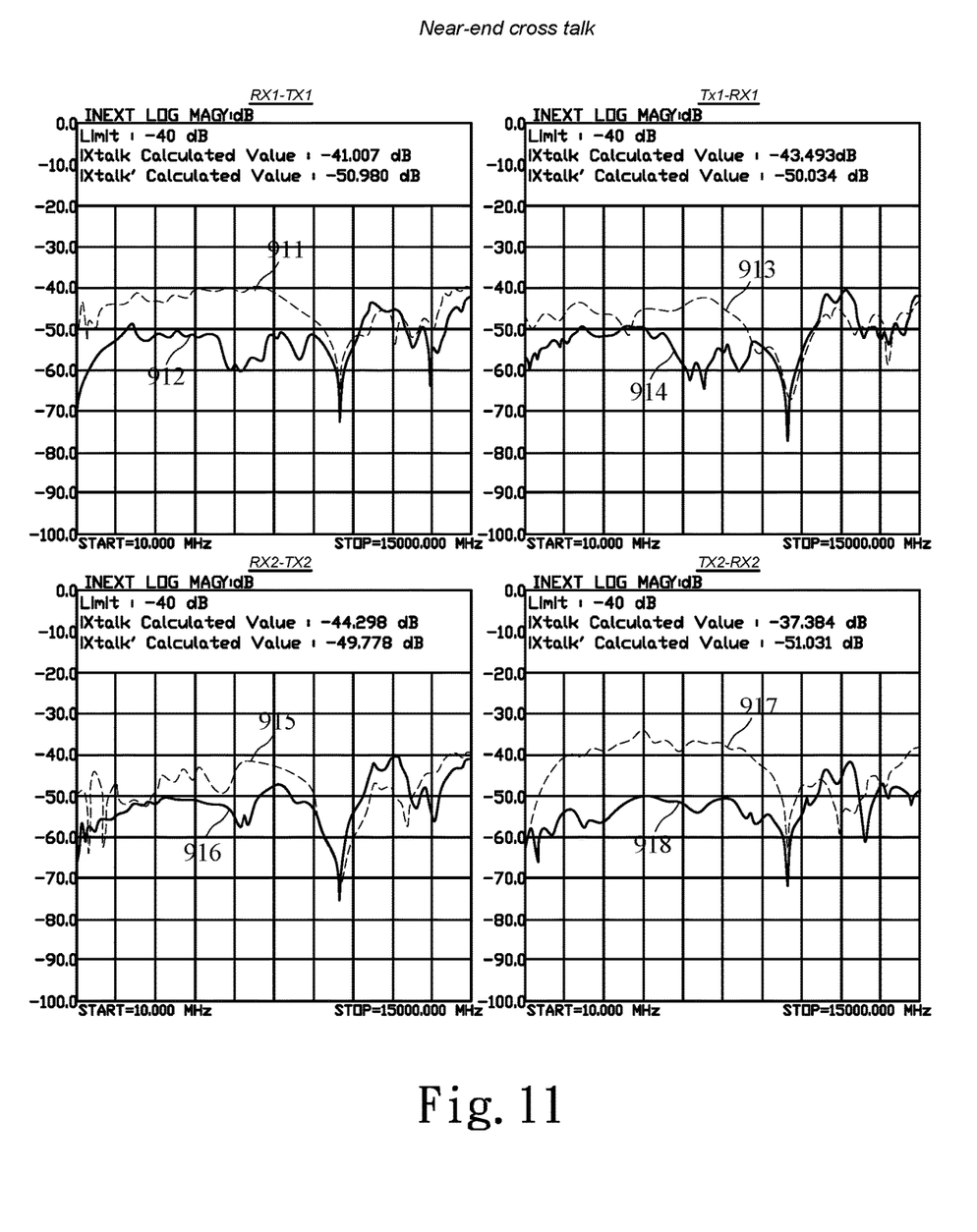
FIG. 11 is an oscillogram obtained by measuring near-end crosstalk to the conventional cable connector and the cable connector of the disclosure, respectively.

Referring to FIG. 11, an oscillogram is shown by measuring near-end crosstalk to the conventional cable connector and the cable connector of the disclosure, respectively. As shown in FIG. 11, curves 911, 913, 915, 917 are obtained by the measurement of near-end crosstalk for transceiver wires (RX1-TX1), (TX1-RX1), (RX2-TX2), and (TX2-RX2) of the cable 13 of the conventional cable connector 100, and curves 912, 914, 916, 918 are obtained by the measurement of near-end crosstalk for transceiver wires (RX1-TX1), (TX1-RX1), (RX2-TX2), and (TX2-RX2) of the cable 29 of the cable connector 200 of the disclosure.

By the measurement results of near-end crosstalk, the near-end crosstalk in the curves 912, 914, 916, 918 of the cable connector 200 of the disclosure are below about 10~15 dB than the near-end crosstalk in the curves 911, 913, 915, 917 of the conventional cable connector 100.

Figure 12:
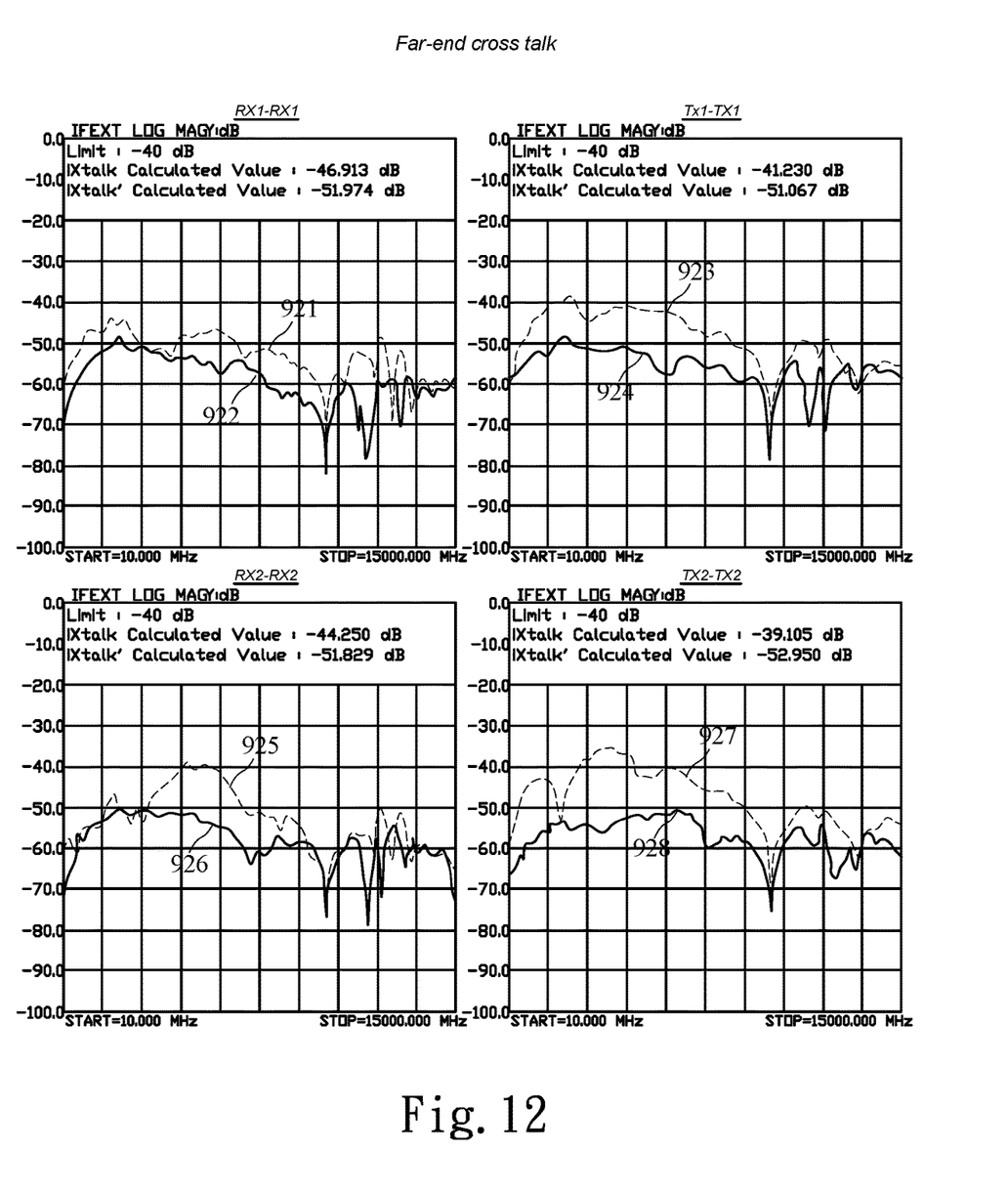
FIG. 12 is an oscillogram obtained by performing a measurement of far-end crosstalk to the conventional cable connector and the cable connector of the disclosure, respectively.

Referring to FIG. 12, an oscillogram is shown by measuring far-end crosstalk to the conventional cable connector and the cable connector of the disclosure, respectively. As shown in FIG. 12, curves 921, 923, 925, 927 are obtained by the measurement of far-end crosstalk for receiving wires (RX1, RX1) and (RX2, RX2) and transmitting wires (TX1, TX1) and (TX2, TX2) of the cable 13 of the conventional cable connector 100, and curves 922, 924, 926, 928 are obtained by the measurement of far-end crosstalk for receiving wires (RX1, RX1) and (RX2, RX2) and transmitting wires (TX1, TX1) and (TX2, TX2) of the cable 29 of the cable connector 200 of the disclosure.

By the measurement results of far-end crosstalk, the far-end crosstalk in the curves 922, 924, 926, 928 of the cable connector 200 of the disclosure are below about 5 dB~13 dB than the far-end crosstalk in the curves 921, 923, 925, 927 of the conventional cable connector 100.

The measurement results for FIG. 10, FIG. 11, and FIG. 12 show that after adding the bump block 27 beside the circuit board 23, the insertion loss of the cable connector 200 will be reduced, and the interferences of the near-end crosstalk and far-end crosstalk will be significantly reduced, such that the quality of signal transmitted by the cable connector 200 can be effectively improved.

The above disclosure is only the preferred embodiment of the present invention and is not used for limiting the scope of the present invention. All equivalent variations and modifications based on shapes, structures, features, and spirits described in claims of the present invention should be included in the claims of the present invention.

The invention claimed is:

1. A cable connector with low crosstalk, including:
a connector body, provided with one end including a plug, and provided with other end including a plurality of plug terminals;
a cable including a plurality of core wires;
a circuit board, provided at one side thereof configured with a plurality of terminal pads, and provided at other side thereof configured with a plurality of core wire pads; wherein the plurality of plug terminals of the connector body are welded on the plurality of terminal pads, and the plurality of core wires of the cable are welded on the plurality of core wire pads of the circuit board;
at least one bump block, arranged beside the other side of the circuit board, and extended outward from the other side of the circuit board; and
a wire divider including a plurality of grooves and at least one perforation, wherein each of the plurality of core wires is embedded in the corresponding groove, and the at least one bump block is inserted into the at least one perforation; wherein part of the at least one bump block passes through the at least one perforation, and is located between the plurality of core wires of the cable.

2. The cable connector according to claim 1, wherein the at least one bump block is integrally formed with the circuit board.

3. The cable connector according to claim 1, wherein the number of the least one bump block is two.

4. The cable connector according to claim 1, further including an upper cover and a lower cover, wherein the plurality of plug terminals of the connector body, the circuit board, the wire divider, and part of the cable are placed in an accommodating space between the upper cover and the lower cover.

5. The cable connector according to claim 1, wherein the cable connector is a connector conforming to USB, HDMI, or Display Port standard protocol.

6. The cable connector according to claim 1, wherein the at least one bump block is a multi-layered board including at least one grounded metal layer, the at least one grounded metal layer in the at least one bump block generates a shield effect between the plurality of core wires in upper row and the plurality of core wires in lower row.

7. A cable connector with low crosstalk, including:
a connector body, provided with one end including a plug, and provided with other end including a plurality of plug terminals;
a cable including a plurality of core wires;
a circuit board, provided at one side thereof configured with a plurality of terminal pads, and provided at other side thereof configured with a plurality of core wire pads; wherein the plurality of plug terminals of the connector body are welded on the plurality of terminal pads, and the plurality of core wires of the cable are welded on the plurality of core wire pads of the circuit board; and
at least one bump block, arranged beside the other side of the circuit board, extended outward from the other side of the circuit board, and located between the plurality of core wires of the cable;
wherein the at least one bump block is a multi-layered board including at least one grounded metal layer, the at least one grounded metal layer in the at least one bump block generates a shield effect between the plurality of core wires in upper row and the plurality of core wires in lower row.

8. The cable connector according to claim 7, wherein the at least one bump block is integrally formed with the circuit board.

9. The cable connector according to claim 7, further including an upper cover and a lower cover, wherein the plurality of plug terminals of the connector body, the circuit board, a wire divider, and part of the cable is placed in an accommodating space between the upper cover and the lower cover.

10. The cable connector according to claim 7, wherein the cable connector is a connector conforming to USB, HDMI, or DisplayPort standard protocol.

* * * * *